United States Patent
Nishiyama et al.

(10) Patent No.: US 12,425,015 B2
(45) Date of Patent: Sep. 23, 2025

(54) SEMICONDUCTOR DEVICE INCLUDING IGBT AND MOSFET

(71) Applicant: Mitsubishi Electric Corporation, Tokyo (JP)

(72) Inventors: Taketo Nishiyama, Tokyo (JP); Hiroki Hidaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 155 days.

(21) Appl. No.: 18/166,984

(22) Filed: Feb. 9, 2023

(65) Prior Publication Data

US 2023/0353138 A1 Nov. 2, 2023

(30) Foreign Application Priority Data

Apr. 27, 2022 (JP) ................. 2022-073303

(51) Int. Cl.
*H03K 17/082* (2006.01)

(52) U.S. Cl.
CPC ................. *H03K 17/0828* (2013.01)

(58) Field of Classification Search
CPC ...... H03K 17/00; H03K 17/08; H03K 17/081; H03K 17/08104; H03K 17/08112; H03K 17/08116; H03K 17/0812; H03K 17/08122; H03K 17/08126; H03K 17/08128; H03K 17/0814; H03K 17/08142; H03K 17/08146; H03K 17/08148; H03K 17/082; H03K 17/0822; H03K 17/0826; H03K 17/0828; H03K 17/10; H03K 17/102; H03K 17/107; H03K 17/12; H03K 17/122; H03K 17/127; H01L 25/03; H01L 25/04; H01L 25/07; H02M 1/32; H02M 1/325; H02M 1/327;

(Continued)

(56) References Cited

U.S. PATENT DOCUMENTS

2007/0159751 A1 7/2007 Hussein et al.
2016/0011058 A1* 1/2016 Kiep .................... H10D 84/617
257/140

(Continued)

FOREIGN PATENT DOCUMENTS

JP 2001-327160 A 11/2001
JP 2008-017557 A 1/2008

(Continued)

OTHER PUBLICATIONS

English translation of JP2012182921. (Year: 2012).*

(Continued)

*Primary Examiner* — Thienvu V Tran
*Assistant Examiner* — Carlos O Rivera-Perez
(74) *Attorney, Agent, or Firm* — Studebaker Brackett PLLC

(57) ABSTRACT

A technique disclosed in the specification of the present application is a technique for increasing a degree of freedom of an IGBT in a device, and as a result, achieving downsizing of the device. A semiconductor device relating to a technique disclosed in the specification of the present application includes a plurality of IGBTs connected in series on a power source line in which bus current flows and a MOSFET connected to the plurality of IGBTs in series. The bus current flows via a drain terminal and a source terminal of the MOSFET.

6 Claims, 11 Drawing Sheets

(58) Field of Classification Search
CPC .......... H02H 3/00; H02H 3/023; H02H 3/025;
H02H 3/08; H02H 3/083; H02H 3/085;
H02H 3/087; H02H 3/10; H02H 3/105;
H02H 9/00; H02H 9/002; H02H 9/02;
H02H 9/023; H02H 9/025; H02H 9/026;
H02H 9/028; G05F 1/569; G05F 1/573;
G05F 1/5735
USPC ....... 361/78, 79, 86, 87, 93.1–93.9, 94–103,
361/106; 323/273–278, 294, 908;
363/50, 55–58
See application file for complete search history.

(56) References Cited

U.S. PATENT DOCUMENTS

2017/0288385 A1    10/2017  Naka et al.
2018/0269867 A1*    9/2018  Terashima ......... H03K 17/0828

FOREIGN PATENT DOCUMENTS

| JP | 2008-042950 A | 2/2008 |
| JP | 2012-182921 A | 9/2012 |
| JP | 2014-143852 A | 8/2014 |
| WO | 2016/038717 A1 | 3/2016 |

OTHER PUBLICATIONS

An Office Action mailed by the Japanese Patent Office on Aug. 20, 2024, which corresponds to Japanese Patent Application No. 2022-073303 and is related to U.S. Appl. No. 18/166,984.

* cited by examiner

F I G. 5
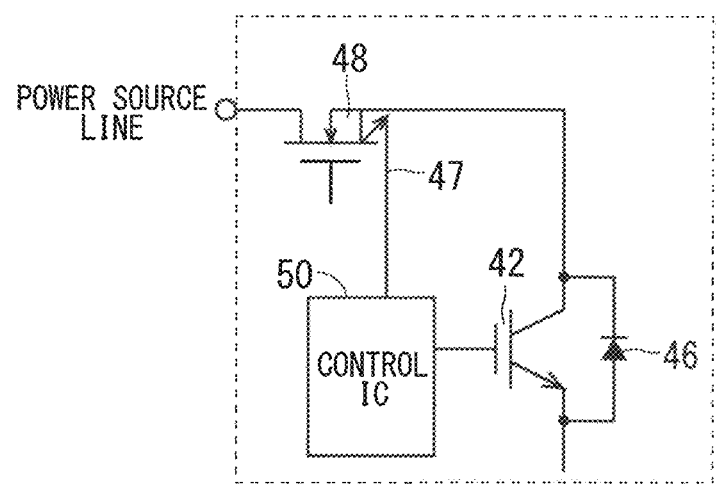

F I G. 6
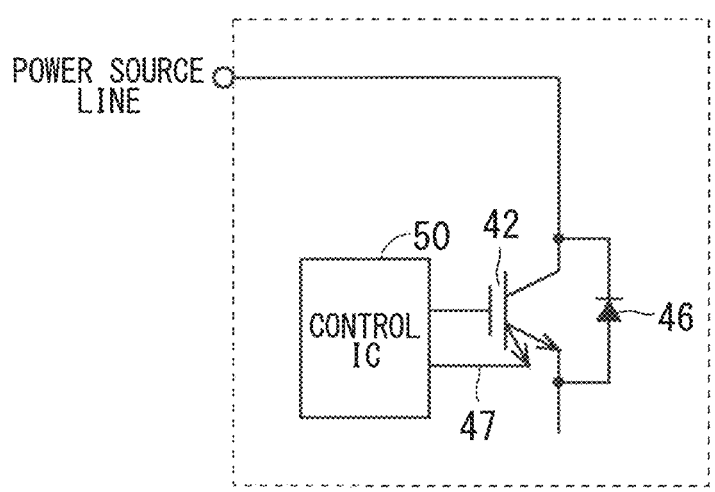

F I G. 7
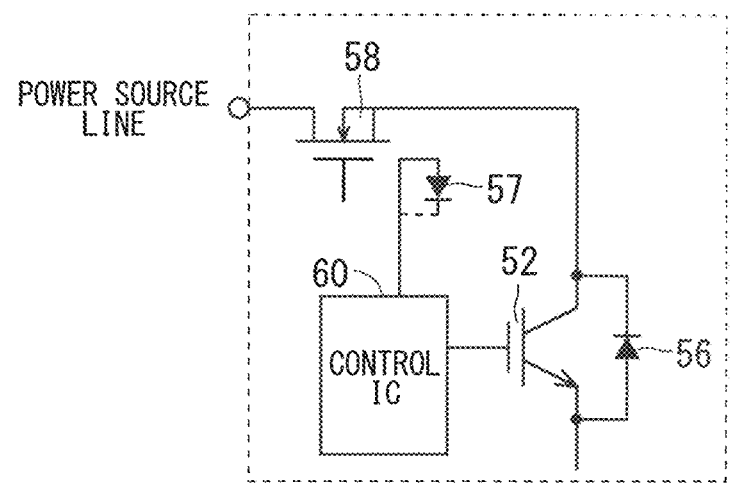

SEMICONDUCTOR DEVICE INCLUDING IGBT AND MOSFET

BACKGROUND OF THE INVENTION

Field of the Invention

A technique disclosed in the specification of the present application relates to a semiconductor device.

Description of the Background Art

For example, examples of a technique of protecting overcurrent in a semiconductor device including an insulated gate bipolar transistor, that is an IGBT, include a technique of providing a metal-oxide-semiconductor field-effect transistor, that is a MOSFET, in detecting ON voltage of the IGBT to prevent high voltage from being applied to a drive circuit as described in Japanese Patent Application Laid-Open No. 2014-143852.

SUMMARY

The technique described in Japanese Patent Application Laid-Open No. 2014-143852 described above includes the MOSFET between the drive circuit and the IGBT, thus can block overcurrent when detecting the ON voltage of the IGBT while preventing the high voltage from being applied to the drive circuit. However, the overcurrent cannot be suppressed.

Thus, the mounted IGBT needs to be an IGBT having breakdown withstand of a predetermined value against the overcurrent before being blocked, so that there is a problem that this leads to increase in size of the IGBT and the semiconductor device.

A technique disclosed in the specification of the present application is a technique for increasing a degree of freedom of an IGBT in a device, and as a result, achieving downsizing of the device.

A semiconductor device according to a first aspect of a technique disclosed in the specification of the present application includes: a plurality of IGBTs connected in series on a power source line in which bus current flows; and a MOSFET connected to the plurality of IGBTs in series, wherein the bus current flows via a drain terminal and a source terminal of the MOSFET.

According to at least the first aspect of the technique disclosed in the specification of the present application, current flowing in a power source line is suppressed by ON resistance of the MOSFET also in a case of a short circuit, for example, thus the IGBT in the device is not limited to an IGBT resistant to large current. Accordingly, a degree of freedom of the IGBT in the device is increased, and as a result, downsizing of the semiconductor device is achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 A diagram schematically illustrating an example of a configuration of the semiconductor device according to the embodiment.

FIG. 6 A diagram schematically illustrating an example of a configuration of the semiconductor device.

FIG. 7 A diagram schematically illustrating an example of a configuration of the semiconductor device according to the embodiment.

DESCRIPTION OF THE PREFERRED EMBODIMENTS

Figure 1:
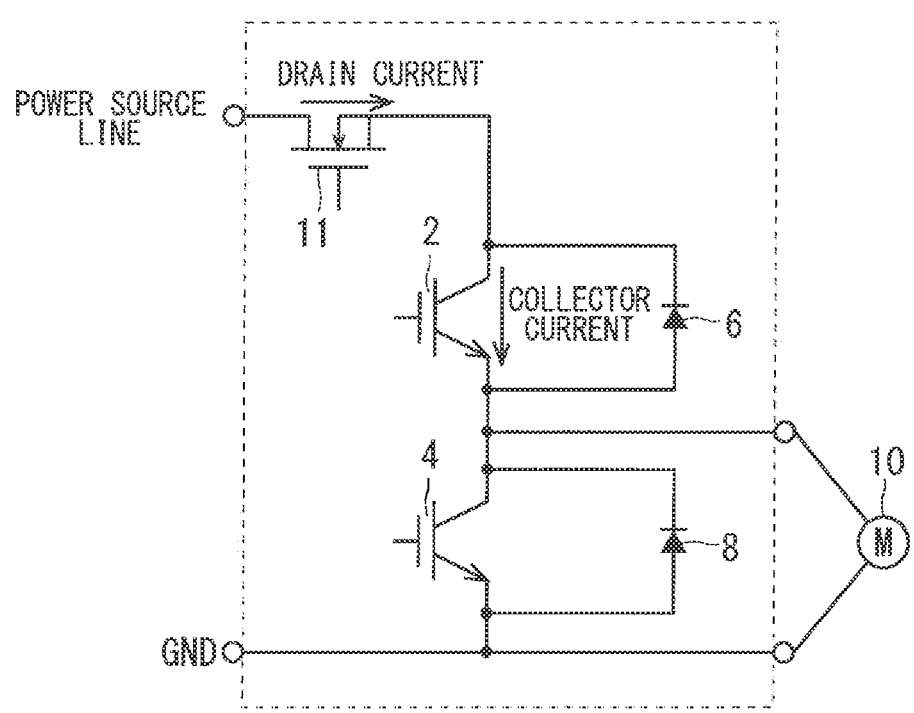
FIG. 1 A diagram schematically illustrating an example of a configuration of a semiconductor device according to an embodiment.

Embodiments are described with reference to the appended drawings hereinafter. Detailed features are also described for explaining a technique in the embodiment hereinafter, however, they are only an exemplification, thus are not always necessary to be able to implement the embodiment.

The drawings are schematically illustrated, thus omission or simplification of the configuration is performed on the drawings for explanatory convenience. A mutual relationship of sizes and positions of constituent elements respectively illustrated in the different drawings is not necessarily illustrated accurately, but may be appropriately changed. A hatching may be drawn in a plane view, for example, as well as a cross-sectional view to easily understand contents of the embodiment.

In the description hereinafter, the same reference numerals will be assigned to the similar constituent elements in the drawings, and the constituent elements having the same reference numeral have the same name and function. Accordingly, the detailed description on them may be omitted to avoid a repetition in some cases.

In the description in the specification of the present application, when there is a description of "comprising", "including", or "having" a certain constituent element, such a description does not indicate an exclusive expression excluding the other constituent element unless otherwise noted.

In the description in the specification of the present application, even when ordinal numbers such as "first" or "second" are stated, the terms are used to facilitate understanding of embodiments, and therefore, the embodiments are not limited to an order which may be caused by the ordinal numbers.

First Embodiment

A semiconductor device according to the present embodiment is described. FIG. 1 is a diagram schematically illustrating an example of a configuration of the semiconductor device according to the present embodiment.

As exemplified in FIG. 1, a power module as a semiconductor device includes an IGBT 2, an IGBT 4 connected to the IGBT 2 in series, a reflux diode 6 antiparallelly connected to the IGBT 2, a reflux diode 8 antiparallelly connected to the IGBT 4, a motor 10 parallelly connected to the IGBT 4, and a MOSFET 11 connected to the IGBT 2 in series on a power source line in which bus current (main current) flows. A source terminal of the MOSFET 11 is connected to a collector electrode of the IGBT 2 in an upper arm. A drain terminal of the MOSFET 11 is connected to a positive electrode side of the power source line. The bus current flows via the drain terminal and the source terminal of the MOSFET 11. The MOSFET 11 may be disposed on a downstream side of the IGBT 2 or the IGBT 4 in the power source line.

The IGBT 2 performs an ON-OFF switching operation. It is preferable that the MOSFET 11 is always in an ON state.

Figure 2:
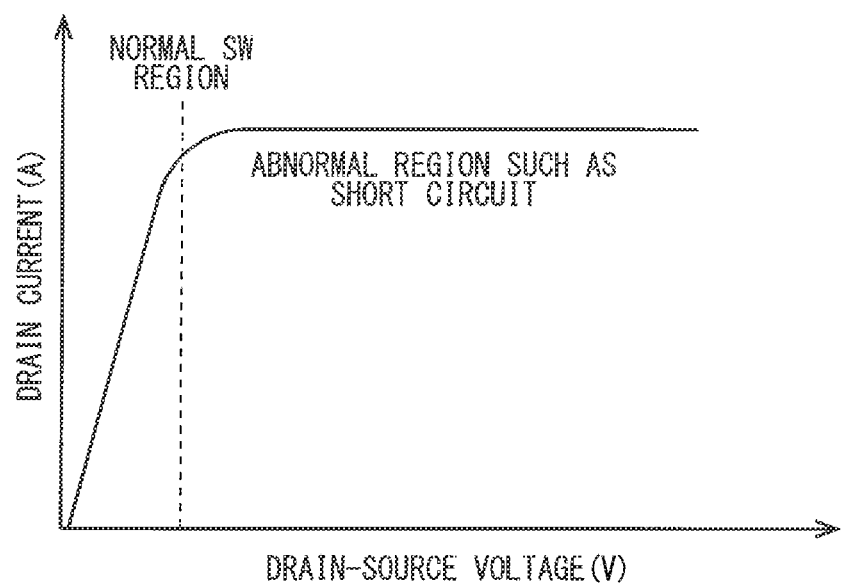
FIG. 2 A diagram illustrating a relationship between drain-source voltage and drain current of a MOSFET in the semiconductor device illustrated in FIG. 1.

FIG. 2 is a diagram illustrating a relationship between drain-source voltage and drain current of the MOSFET 11 in the semiconductor device illustrated in FIG. 1. In FIG. 2, a vertical axis indicates drain current [A], and a lateral axis indicates drain-source voltage [V].

As exemplified in FIG. 2, flow of large current is suppressed in making a transition from a normal switching region to an abnormal region such as a short circuit.

Figure 3:
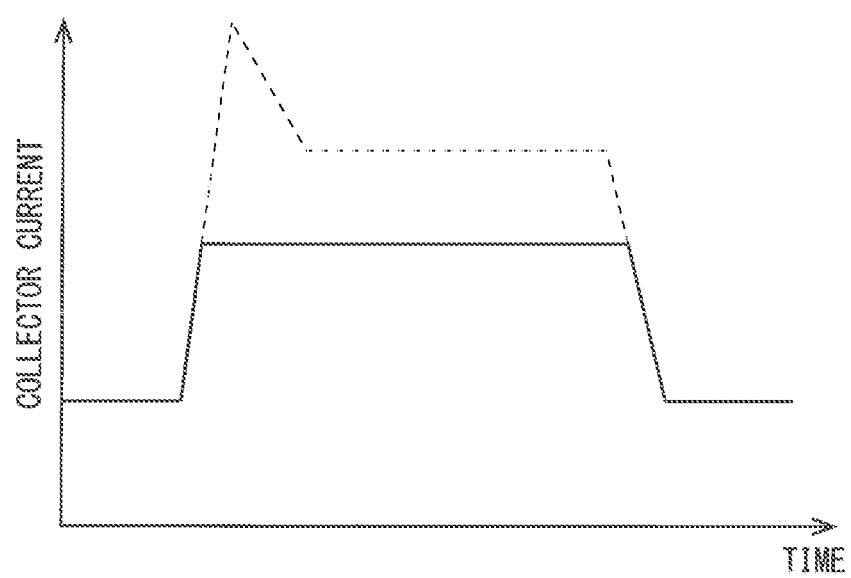
FIG. 3 A diagram illustrating a temporal transition of collector current of an IGBT in the semiconductor device illustrated in FIG. 1.

FIG. 3 is a diagram illustrating a temporal transition of collector current of the IGBT 2 in the semiconductor device illustrated in FIG. 1. In FIG. 3, the vertical axis indicates the collector current and a lateral axis indicates a time. In FIG. 3, a solid line indicates a temporal transition of the collector current when the MOSFET 11 is included, and a dotted line indicates a temporal transition of the collector current when the MOSFET 11 is not included.

As exemplified in FIG. 3, the MOSFET 11 is connected to the power source line in series, thus when large current such as a short-circuit current flows in the power source line, ON resistance of the MOSFET 11 can suppress flow of current above a certain level to the power source line.

Herein, some of a method of selecting a conventional IGBT is described. In a case of a circuit reducing gate voltage after detecting large current such as an overcurrent protection circuit, it takes a predetermined period of time to detect the large current and narrow the current, and during the period of time, large current having a predetermined value or more flows in the IGBT. Thus, the IGBT is designed to increase breakdown withstand by increasing a thickness or a size of a chip, for example, so as to be resistant to the large current having the predetermined value or more.

In the meanwhile, according to the present embodiment, current flowing in the power source line is suppressed by the ON resistance of the MOSFET 11 also in a case of a short circuit, for example, thus the IGBT in the device is not limited to an IGBT resistant to the large current. Accordingly, a degree of freedom of the IGBT in the device is increased, and as a result, downsizing of the semiconductor device is achieved.

Figure 4:
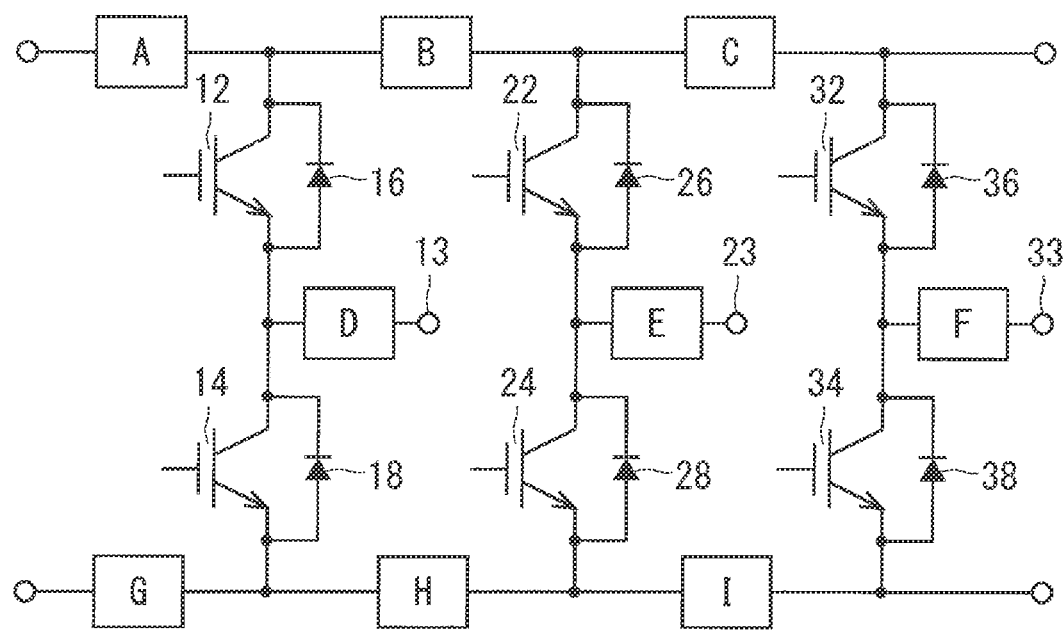
FIG. 4 A diagram schematically illustrating a modification example of a configuration of the semiconductor device according to the embodiment.

FIG. 4 is a diagram schematically illustrating a modification example of a configuration of the semiconductor device according to the present embodiment.

As exemplified in FIG. 4, the semiconductor device is a three-phase alternating-current inverter circuit including six IGBTs and reflux diodes antiparallelly connected to the six IGBTs, respectively. Specifically, the semiconductor device includes an IGBT 12, an IGBT 14 connected to the IGBT 12 in series, a connection terminal 13 connected to a load between the IGBT 12 and the IGBT 14, a reflux diode 16 antiparallelly connected to the IGBT 12, a reflux diode 18 antiparallelly connected to the IGBT 14, an IGBT 22, an IGBT 24 connected to the IGBT 22 in series, a connection terminal 23 connected to a load between the IGBT 22 and the IGBT 24, a reflux diode 26 antiparallelly connected to the IGBT 22, a reflux diode 28 antiparallelly connected to the IGBT 24, an IGBT 32, an IGBT 34 connected to the IGBT 32 in series, a connection terminal 33 connected to a load between the IGBT 32 and the IGBT 34, a reflux diode 36 antiparallelly connected to the IGBT 32, and a reflux diode 38 antiparallelly connected to the IGBT 34.

In the configuration described above, the MOSFET can be mounted to the power source line of each of the connection terminal 13, the connection terminal 23, and the connection terminal 33 as connection portions each connected to the load. Specifically, it is sufficient that at least one MOSFET is mounted to the power source line of each of a candidate portion A, a candidate portion B, a candidate portion C, a candidate portion D, a candidate portion E, a candidate portion F, a candidate portion G, a candidate portion H, and a candidate portion I in FIG. 4. Also applicable is a case where the MOSFET is mounted to at least one of all the candidate portions described above.

The MOSFET is mounted as described above, thus current at a time of short circuit, for example, can be appropriately suppressed in each phase of the three-phase alternating current inverter circuit.

It is preferable that the MOSFET described above is always in an ON state when the semiconductor device is actually operated. The MOSFET is always in the ON state, thus even when overcurrent suddenly occurs, bus current flowing in the IGBT can be suppressed without delay.

Second Embodiment

A semiconductor device according to the present embodiment is described. In the description hereinafter, the same reference numerals as those described in the above embodiment will be assigned to the similar constituent elements in the drawings, and detailed description thereof is appropriately omitted.

<Configuration of Semiconductor Device>

FIG. 5 is a diagram schematically illustrating an example of a configuration of the semiconductor device according to the present embodiment.

As exemplified in FIG. 5, a power module as the semiconductor device includes an IGBT 42, a MOSFET 48 connected to the IGBT 42 in series, a reflux diode 46 antiparallelly connected to the IGBT 42, and a control IC 50 connected to a gate electrode of the IGBT 42 on the power source line in which bus current flows. Although the illustration is omitted herein, the IGBT 4 illustrated in FIG. 1 is connected to an emitter electrode of the IGBT 42 in series, and furthermore, the reflux diode 8 is antiparallelly connected to the IGBT 4, and the motor 10 is parallelly connected to the IGBT 4. The MOSFET 48 includes a current sensor 47 in a chip. The control IC 50 can control gate voltage of the IGBT 42 based on sense current detected in the current sensor 47. A source terminal of the MOSFET 48 is connected to a collector electrode of the IGBT 42. A drain terminal of the MOSFET 48 is connected to a positive electrode side of the power source line. The MOSFET 48 may be disposed on a downstream side of the IGBT 42 or the IGBT 4 in the power source line.

The IGBT 42 performs an ON-OFF switching operation. It is preferable that the MOSFET 48 is always in an ON state.

According to the present embodiment, current flowing in the power source line is suppressed by the ON resistance of the MOSFET 48 also in a case of a short circuit, for example, thus the IGBT in the device is not limited to an IGBT resistant to the large current. Accordingly, a degree of freedom of the IGBT in the device is increased, and as a result, downsizing of the semiconductor device is achieved. The MOSFET 48 is always in the ON state, thus even when overcurrent suddenly occurs, bus current flowing in the IGBT 42 can be suppressed without delay.

FIG. 6 is a diagram schematically illustrating an example of a configuration of the semiconductor device. The configuration illustrated in FIG. 6 is different from that in FIG. 5 in that it does not include the MOSFET 48.

As exemplified in FIG. 6, a power module as the semiconductor device includes the IGBT 42, the reflux diode 46 antiparallelly connected to the IGBT 42, and the control IC 50 connected to the gate electrode of the IGBT 42 on the power source line in which bus current flows. Although the illustration is omitted herein, the IGBT 4 illustrated in FIG. 1 is connected to the emitter electrode of the IGBT 42 in series, and furthermore, the reflux diode 8 is antiparallelly connected to the IGBT 4, and the motor 10 is parallelly connected to the IGBT 4. The IGBT 42 includes a current sensor 47 in a chip. The control IC 50 can control gate voltage of the IGBT 42 based on sense current detected in the current sensor 47.

Third Embodiment

A semiconductor device according to the present embodiment is described. In the description hereinafter, the same reference numerals as those described in the above embodiment will be assigned to the similar constituent elements in the drawings, and detailed description thereof is appropriately omitted.

<Configuration of Semiconductor Device>

FIG. 7 is a diagram schematically illustrating an example of a configuration of the semiconductor device according to the present embodiment.

As exemplified in FIG. 7, a power module as the semiconductor device includes an IGBT 52, a MOSFET 58 connected to the IGBT 52 in series, a reflux diode 56 antiparallelly connected to the IGBT 52, and a control IC 60 connected to a gate electrode of the IGBT 52 on the power source line in which bus current flows. Although the illustration is omitted herein, the IGBT 4 illustrated in FIG. 1 is connected to an emitter electrode of the IGBT 52 in series, and furthermore, the reflux diode 8 is antiparallelly connected to the IGBT 4, and the motor 10 is parallelly connected to the IGBT 4. The MOSFET 58 includes a temperature sensor 57 in a chip. The control IC 60 can control gate voltage of the IGBT 52 based on a temperature signal inputted from the temperature sensor 57. A source terminal of the MOSFET 58 is connected to a collector electrode of the IGBT 52. A drain terminal of the MOSFET 58 is connected to a positive electrode side of the power source line. The MOSFET 58 may be disposed on a downstream side of the IGBT 52 or the IGBT 4 in the power source line.

The IGBT 52 performs an ON-OFF switching operation. It is preferable that the MOSFET 58 is always in an ON state.

According to the present embodiment, current flowing in the power source line is suppressed by the ON resistance of the MOSFET 58 also in a case of a short circuit, for example, thus the IGBT in the device is not limited to an IGBT resistant to the large current. Accordingly, a degree of freedom of the IGBT in the device is increased, and as a result, downsizing of the semiconductor device is achieved. A current sensor, for example, is unnecessary, thus downsizing of the semiconductor device is achieved.

Figure 8:
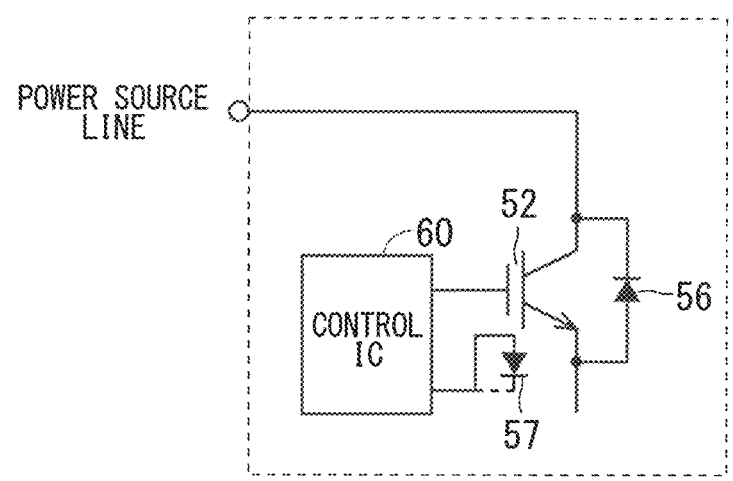
FIG. 8 A diagram schematically illustrating an example of a configuration of the semiconductor device.

FIG. 8 is a diagram schematically illustrating an example of a configuration of the semiconductor device. The configuration illustrated in FIG. 8 is different from that in FIG. 7 in that it does not include the MOSFET 58.

As exemplified in FIG. 8, a power module as the semiconductor device includes the IGBT 52, the reflux diode 56 antiparallelly connected to the IGBT 52, and the control IC 60 connected to the gate electrode of the IGBT 52 on the power source line in which bus current flows. Although the illustration is omitted herein, the IGBT 4 illustrated in FIG. 1 is connected to an emitter electrode of the IGBT 52 in series, and furthermore, the reflux diode 8 is antiparallelly connected to the IGBT 4, and the motor 10 is parallelly connected to the IGBT 4. The IGBT 52 includes a temperature sensor 57 in a chip. The control IC 60 can control gate voltage of the IGBT 52 based on a temperature signal inputted from the temperature sensor 57.

Fourth Embodiment

A semiconductor device according to the present embodiment is described. In the description hereinafter, the same reference numerals as those described in the above embodiment will be assigned to the similar constituent elements in the drawings, and detailed description thereof is appropriately omitted.

<Configuration of Semiconductor Device>

Figure 9:
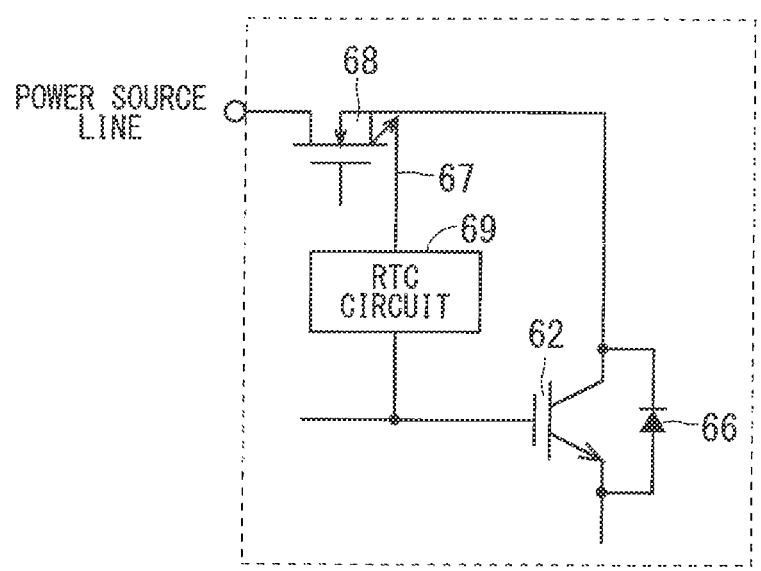
FIG. 9 A diagram schematically illustrating an example of a configuration of the semiconductor device according to the embodiment.

FIG. 9 is a diagram schematically illustrating an example of a configuration of the semiconductor device according to the present embodiment.

As exemplified in FIG. 9, a power module as the semiconductor device includes an IGBT 62, a MOSFET 68 connected to the IGBT 62 in series, a reflux diode 66 antiparallelly connected to the IGBT 62, and a real time control (that is to say, RTC) circuit 69 connected to a gate electrode of the IGBT 62 on the power source line in which bus current flows. Although the illustration is omitted herein, the IGBT 4 illustrated in FIG. 1 is connected to an emitter electrode of the IGBT 62 in series, and furthermore, the reflux diode 8 is antiparallelly connected to the IGBT 4, and the motor 10 is parallelly connected to the IGBT 4. The MOSFET 68 includes a current sensor 67 in a chip. The RTC circuit 69 can control gate voltage of the IGBT 62 based on sense current detected in the current sensor 67. A source terminal of the MOSFET 68 is connected to a collector electrode of the IGBT 62. A drain terminal of the MOSFET 68 is connected to a positive electrode side of the power source line. The MOSFET 68 may be disposed on a downstream side of the IGBT 62 or the IGBT 4 in the power source line.

The IGBT 62 performs an ON-OFF switching operation. It is preferable that the MOSFET 68 is always in an ON state.

According to the present embodiment, current flowing in the power source line is suppressed by the ON resistance of the MOSFET 68 also in a case of a short circuit, for example, thus the IGBT in the device is not limited to an IGBT resistant to the large current. Accordingly, a degree of freedom of the IGBT in the device is increased, and as a result, downsizing of the semiconductor device is achieved. The RTC circuit 69 controls gate voltage of the IGBT 62 so that the IGBT 62 has a predetermined voltage value, thus an ON operation of the IGBT 62 can be safely blocked also in a short-circuit operation.

Figure 10:
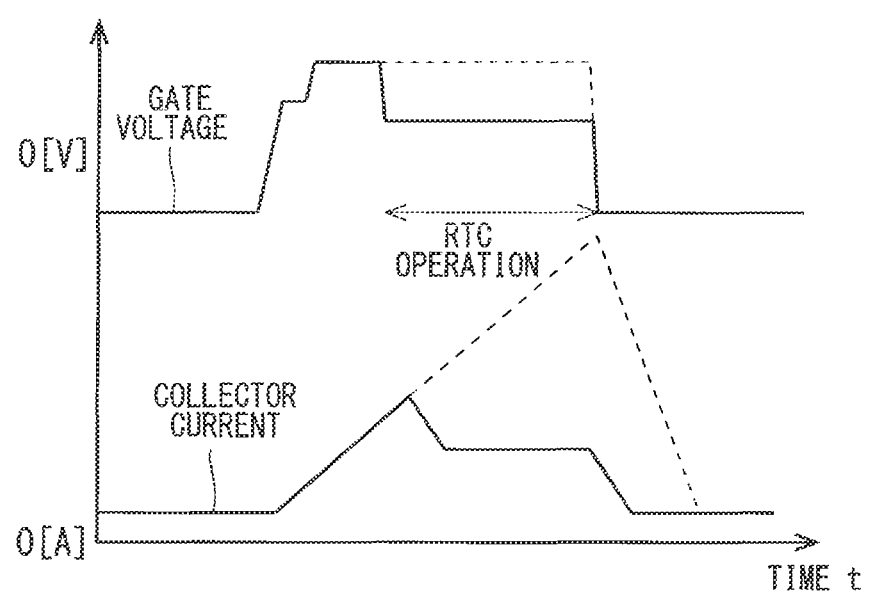
FIG. 10 A diagram illustrating a temporal transition of collector current and a temporal transition of gate voltage of an IGBT in a semiconductor device illustrated in FIG. 9.

FIG. 10 is a diagram illustrating a temporal transition of collector current and a temporal transition of gate voltage of the IGBT 62 in the semiconductor device illustrated in FIG. 9. In FIG. 10, the vertical axis indicates the collector current [A] and the gate voltage [V], and a lateral axis indicates a time. In FIG. 10, a solid line indicates a temporal transition of the collector current and the gate electrode when the RTC circuit 69 is included, and a dotted line indicates a temporal transition of the collector current and the gate electrode when the RTC circuit 69 is not included.

As exemplified in FIG. 10, the RTC circuit 59 controls the gate voltage of the IGBT 62 so that the IGBT 62 has a predetermined voltage value, thus even when large current such as a short-circuit current flows in the power source line, flow of current above a certain level to the IGBT 62 can be suppressed.

Figure 11:
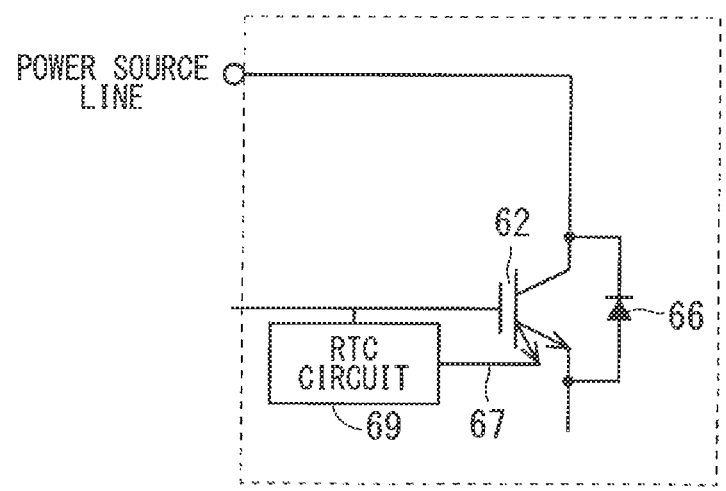
FIG. 11 A diagram schematically illustrating an example of a configuration of the semiconductor device.

FIG. 11 is a diagram schematically illustrating an example of a configuration of the semiconductor device. The configuration illustrated in FIG. 11 is different from that in FIG. 9 in that it does not include the MOSFET 68.

As exemplified in FIG. 11, a power module as the semiconductor device includes the IGBT 62, the reflux diode 66 antiparallelly connected to the IGBT 62, and the RTC circuit 69 connected to the gate electrode of the IGBT 62 on the power source line in which bus current flows. Although the illustration is omitted herein, the IGBT 4 illustrated in FIG. 1 is connected to an emitter electrode of the IGBT 62 in series, and furthermore, the reflux diode 8 is antiparallelly connected to the IGBT 4, and the motor 10 is parallelly connected to the IGBT 4. The IGBT 62 includes a current sensor 67 in a chip. The RTC circuit 69 can control gate voltage of the IGBT 62 based on sense current detected in the current sensor 67.

<Effects Generated by Embodiments Described Above>

Examples of effects generated by the above embodiments are described next. It should be noted that, in the following description, the effects are described based on the specific configurations exemplified in the above embodiments, however, other specific configurations may be applied in place of the configurations illustrated in the specification of the present application, within the scope of producing the similar effects. That is to say, in the description hereinafter, only one of the associated specific configurations is described as a representative in some cases, however, the specific configuration described as the representative may be replaced with the other associated specific configuration.

Also, the replacement may be implemented with a plurality of embodiments. That is to say, each of the configurations exemplified in the different embodiments may be combined with one another to produce the similar effects.

According to the embodiments described above, the semiconductor device includes the plurality or IGBTs (the IGBT 2, the IGBT 4, the IGBT 12, the IGBT 14, the IGBT 22, the IGBT 24, the IGBT 32, the IGBT 34, the IGBT 42, the IGBT 52, or the IGBT 62) connected in series on the power source line in which the bus current flows and the MOSFET 11 (or the MOSFET 48, the MOSFET 58, the MOSFET 68) connected to the plurality of IGBTs in series. Then, the bus current flows via the drain terminal and the source terminal of the MOSFET 11 (or the MOSFET 48, the MOSFET 58, and the MOSFET 68).

According to such a configuration, the bus current flows in the MOSFET on the power source line. The current flowing in the power source line is suppressed by the ON resistance of the MOSFET 11 also in the case of the short circuit, for example, thus the IGBT in the device is not limited to the IGBT resistant to the large current. Accordingly, a degree of freedom of the IGBT in the device is increased (by reason that downsizing of the IGBT is achieved), and as a result, downsizing of the semiconductor device is achieved.

Even in the case where the other configurations other than the configurations illustrated in the specification of the present application is appropriately added to the configuration described above, that is to say, the other configurations other than the configurations illustrated in the specification of the present application, which are not referred to as configurations described above are appropriately added, the similar effects can be produced.

According to the embodiments described above, the MOSFET 11 is always in the ON state during the operation of at least one IGBT. According to such a configuration, even when overcurrent suddenly occurs, the bus current in the IGBT can be suppressed without delay.

According to the embodiments described above, the semiconductor device includes the current sensor 47 provided in the semiconductor chip constituting the MOSFET 48 and the control circuit controlling the gate voltage of the IGBT 42 based on the sense current detected in the current sensor 47. Herein, the control circuit corresponds to at least one of the control IC 50 and/or the RTC circuit 69, for example. According to such a configuration, the circuit for detecting the ON voltage of the IGBT or the current sensor of the IGBT is unnecessary, thus the semiconductor device can be downsized.

According to the embodiments described above, the control circuit is a real time control circuit (the RTC circuit 69). According to such a configuration, the gate voltage of the IGBT 62 can be limited by the RTC circuit 69, thus the IGBT can be safely blocked at the time of the short circuit operation.

According to the embodiments described above, the semiconductor device includes the temperature sensor 57 provided in the semiconductor chip constituting the MOSFET 58 and the control circuit controlling the gate voltage of the IGBT 52 based on the temperature signal outputted from the temperature sensor 57. Herein, the control circuit corresponds to the control IC 60, for example. According to such a configuration, the temperature sensor of the IGBT is unnecessary, thus the semiconductor device can be downsized.

Modification Example in Embodiments Described Above

In the embodiments described above, the current sensor 47 and the temperature sensor 57 are separately provided, however, they may be provided together. The temperature sensor 57 and the RTC circuit 69 may be provided together.

In the embodiments described above, material properties, materials, dimensions, shapes, relative arrangement relations, conditions for implementation, and so forth for the respective constituent elements may be described, however, these represent a mare example in all aspects, and are not limited to the description in the specification of the present application.

Accordingly, it is understood that numerous unexemplified modifications variations, and equivalents can be devised within the scope of the technique disclosed in the specification of the present application. For example, the following cases where at least one of the constituent elements is to be modified, added, or omitted, further, at least one of the constituent elements of at least one of the embodiments is extracted and then combined with constituent elements of the other embodiment, are involved.

Further, in the embodiments described above, when names of materials are stated unless otherwise specified, an alloy of the material and other additives, and so forth are included, so far as consistent with the embodiments.

What has been described in the specification of the present application is referred for all purposes regarding the present technique. It is thus not an admission that any of the descriptions provided herein are conventional techniques.

The aspects of the present disclosure is collectively described hereinafter as an additional statement.

(Additional Statement 1)
A semiconductor device, comprising:
a plurality of IGBTs connected in series on a power source line in which bus current flows; and
a MOSFET connected to the plurality of IGBTs in series, wherein
the bus current flows via a drain terminal and a source terminal of the MOSFET.

(Additional Statement 2)
The semiconductor device according to the additional statement 1, wherein the MOSFET is always in an ON state when at least one of the IGBTs is operated.

(Additional Statement 3)
The semiconductor device according to the additional statement 1 or 2, further comprising:
a current sensor provided in a semiconductor chip constituting the MOSFET; and
a control circuit controlling gate voltage of one of the IGBTs based on sense current detected in the current sensor.

(Additional Statement 4)
The semiconductor device according to the additional statement 3, wherein
the control circuit is a real time control circuit.

(Additional Statement 5)
The semiconductor device according to any one of the additional statements 1 to 4, further comprising:
a temperature sensor provided in a semiconductor chip constituting the MOSFET; and
a control circuit controlling gate voltage of one of the IGBTs based on a temperature signal outputted from the temperature sensor.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a plurality of IGBTs connected in series on a power source line in which bus current is configured to flow;
a MOSFET connected to the plurality of IGBTs in series;
a current sensor that is configured to detect a sense current and provided in a semiconductor chip constituting the MOSFET; and
a real time control circuit configured to receive an output of the current sensor and control a gate voltage of one of the IGBTs based on the sense current detected in the current sensor by reducing the gate voltage to a voltage between a maximum and a minimum of the gate voltage when a collector current of the IGBTs exceeds a threshold, wherein
the bus current is configured to flow via a drain terminal and a source terminal of the MOSFET.

2. The semiconductor device according to claim 1, wherein
the MOSFET is configured to be always in an ON state when at least one of the IGBTs is operated.

3. The semiconductor device according to claim 1, wherein
the real time control circuit is configured to control the gate voltage of only the one of the IGBTs.

4. A semiconductor device, comprising:
a plurality of IGBTs connected in series on a power source line in which bus current is configured to flow;
a MOSFET connected to the plurality of IGBTs in series;
a temperature sensor provided in a semiconductor chip constituting the MOSFET; and
a real time control circuit configured to receive an output of the temperature sensor and control a gate voltage of one of the IGBTs based on a temperature signal configured to be output from the temperature sensor without a current configured to be detected in a current sensor by reducing the gate voltage to a voltage between a maximum and a minimum of the gate voltage when a collector current of the IGBTs exceeds a threshold, wherein
the bus current is configured to flow via a drain terminal and a source terminal of the MOSFET.

5. The semiconductor device according to claim 4, wherein the MOSFET is configured to be always in an ON state when at least one of the IGBTs is operated.

6. The semiconductor device according to claim 4, wherein the real time control circuit is configured to control the gate voltage of only the one of the IGBTs.

* * * * *